United States Patent
Kidd et al.

(10) Patent No.: US 10,745,803 B2
(45) Date of Patent: Aug. 18, 2020

(54) METHOD OF FORMING A MOISTURE-TOLERANT COATING ON A SILICON CARBIDE FIBER

(71) Applicant: Rolls-Royce High Temperature Composites Inc., Cypress, CA (US)

(72) Inventors: Richard W. Kidd, Rancho Palos Verdes, CA (US); Robert Shinavski, Mission Viejo, CA (US)

(73) Assignee: ROLLS-ROYCE HIGH TEMPERATURE COMPOSITES INC., Cypress, CA (US)

( * ) Notice: Subject to any disclaimer, the term of this patent is extended or adjusted under 35 U.S.C. 154(b) by 125 days.

(21) Appl. No.: 16/003,615

(22) Filed: Jun. 8, 2018

(65) Prior Publication Data

US 2018/0363132 A1 Dec. 20, 2018

Related U.S. Application Data

(60) Provisional application No. 62/520,110, filed on Jun. 15, 2017.

(51) Int. Cl.
*C23C 16/34* (2006.01)
*C04B 35/628* (2006.01)
(Continued)

(52) U.S. Cl.
CPC .......... *C23C 16/342* (2013.01); *C04B 35/565* (2013.01); *C04B 35/62863* (2013.01);
(Continued)

(58) Field of Classification Search
CPC . C23C 16/342; C23C 16/34; C04B 35/62868; C04B 35/62844; C04B 35/62884; C04B 35/62894
See application file for complete search history.

(56) References Cited

U.S. PATENT DOCUMENTS

| | | |
|---|---|---|
| 4,642,271 A | 2/1987 | Rice |
| 5,593,728 A | 1/1997 | Moore et al. |

(Continued)

FOREIGN PATENT DOCUMENTS

KR 100298524 B1 * 9/2001 ............ D06M 11/80

OTHER PUBLICATIONS

Yuan, Mengjiao, et al., "Formation of boron nitride coatings on silicon carbide fibers using trimethylborate vapor". Applied Surface Science 382 (2016) 27-33.*

(Continued)

*Primary Examiner* — Bret P Chen
(74) *Attorney, Agent, or Firm* — Brinks Gilson & Lione

(57) ABSTRACT

A method of forming a moisture-tolerant coating on a silicon carbide fiber includes exposing a silicon carbide fiber to a gaseous N precursor comprising nitrogen at an elevated temperature, thereby introducing nitrogen into a surface region of the silicon carbide fiber, and exposing the silicon carbide fiber to a gaseous B precursor comprising boron at an elevated temperature, thereby introducing boron into the surface region of the silicon carbide fiber. Silicon-doped boron nitride is formed at the surface region of the silicon carbide fiber without exposing the silicon carbide fiber to a gaseous Si precursor comprising Si. Thus, a moisture-tolerant coating comprising the silicon-doped boron nitride is grown in-situ on the silicon carbide fiber.

20 Claims, 3 Drawing Sheets

(51) Int. Cl.
 C04B 35/80 (2006.01)
 C04B 35/565 (2006.01)
 C23C 16/30 (2006.01)
 D06M 11/58 (2006.01)
 D06M 11/80 (2006.01)
 F01D 25/00 (2006.01)
 D06M 101/16 (2006.01)

(52) U.S. Cl.
 CPC .. *C04B 35/62868* (2013.01); *C04B 35/62884* (2013.01); *C04B 35/62894* (2013.01); *C04B 35/62897* (2013.01); *C04B 35/806* (2013.01); *C23C 16/308* (2013.01); *D06M 11/58* (2013.01); *D06M 11/80* (2013.01); *F01D 25/005* (2013.01); *C04B 2235/3826* (2013.01); *C04B 2235/46* (2013.01); *C04B 2235/465* (2013.01); *C04B 2235/524* (2013.01); *C04B 2235/5244* (2013.01); *C04B 2235/616* (2013.01); *D06M 2101/16* (2013.01); *F05D 2300/6033* (2013.01)

(56) References Cited

U.S. PATENT DOCUMENTS

| | | | | |
|---|---|---|---|---|
| 5,952,100 | A * | 9/1999 | Corman | B32B 18/00 428/368 |
| 6,040,008 | A * | 3/2000 | Sacks | C04B 35/62281 427/226 |
| 6,069,102 | A * | 5/2000 | Sacks | C04B 35/565 264/625 |
| 6,228,453 | B1 * | 5/2001 | Fareed | B32B 18/00 428/403 |
| 6,365,233 | B1 * | 4/2002 | Corman | B32B 18/00 427/430.1 |
| 7,427,428 | B1 | 9/2008 | DiCarlo et al. | |
| 7,687,016 | B1 | 3/2010 | DiCarlo et al. | |
| 2003/0196305 | A1 * | 10/2003 | Kebbede | B23P 6/005 29/402.11 |
| 2004/0142173 | A1 * | 7/2004 | Chapman | C04B 41/009 428/408 |
| 2007/0099527 | A1 * | 5/2007 | Brun | D06M 10/08 442/185 |
| 2010/0289192 | A1 * | 11/2010 | DiCarlo | C04B 35/565 264/625 |
| 2011/0171399 | A1 | 7/2011 | Brun et al. | |
| 2012/0076927 | A1 * | 3/2012 | Bhatt | C04B 35/565 427/122 |
| 2013/0062000 | A1 * | 3/2013 | Roberts, III | C04B 37/001 156/73.5 |
| 2015/0251959 | A1 | 9/2015 | Goujard et al. | |
| 2015/0329965 | A1 * | 11/2015 | Gadgil | H01L 21/02529 423/290 |
| 2016/0159702 | A1 * | 6/2016 | Lazur | C04B 35/62863 427/249.15 |
| 2016/0237595 | A1 * | 8/2016 | Maxwell | D01F 9/12 |
| 2016/0356499 | A1 * | 12/2016 | Freeman | F23R 3/007 |
| 2017/0117145 | A1 * | 4/2017 | Miyahara | H01L 21/0234 |
| 2017/0144925 | A1 * | 5/2017 | Dunn | C03C 17/001 |

OTHER PUBLICATIONS

Hurwitz, Frances, et al., "BN and Si-doped BN coatings on woven fabrics". Ceramic Engineering and Science Proceedings, 23, Jan. 2002, pp. 1-8.*

Sun, Ellen Y., et al., "Intermediate-Temperature Environmental Effects on Boron Nitride-Coated Silicon Carbide-Fiber-Reinforced Glass-Ceramic Composites". J. Am. Ceram. Soc., 80 [3] 609-14 (1997).*

Pippel, E., et al., "CVD-coated boron nitride on continuous silicon carbide fibres: structure and nanocomposition". Journal of the European Ceramic Society 20 (2000) 1837-1844.*

Extended European Search Report, dated Oct. 30, 2018, 10 pgs., issued in European Patent Application No. 18177154.4.

S. Le Gallet et al., "Microstructural and microtextural investigations of boron nitride deposited from $BCl_3$—$NH_3$—$H_2$ gas mixtures", *Journal of the European Ceramic Society,* 24 (2004) 33-34.

F. Rebillat et al., "Chemical and Mechanical Alterations of SiC Nicalon Fiber Properties During the CVD/CVI Process for Boron Nitride", *Acta Mater.,* 47, 5 (1999) 1685-1696.

* cited by examiner

METHOD OF FORMING A MOISTURE-TOLERANT COATING ON A SILICON CARBIDE FIBER

RELATED APPLICATION

The present patent document claims the benefit of priority under 35 U.S.C. § 119(e) to U.S. Provisional Patent Application Ser. No. 62/520,110, which was filed on Jun. 15, 2017, and is hereby incorporated by reference in its entirety.

TECHNICAL FIELD

The present disclosure is directed generally to the fabrication of ceramic matrix composites (CMCs) and more particularly to a method of coating ceramic fibers.

BACKGROUND

Ceramic matrix composites (CMCs), which include ceramic fibers embedded in a ceramic matrix, exhibit a combination of properties that make them promising candidates for industrial applications that demand excellent thermal and mechanical properties along with low weight, such as gas turbine engine components.

An interphase coating comprising carbon or boron nitride is typically applied to the ceramic fibers (e.g., silicon carbide fibers) as part of the CMC fabrication process. In use, the interphase material may act as a compliant layer to enhance toughness and crack deflection in the final densified CMC.

BRIEF SUMMARY

A method of forming a moisture-tolerant coating on a silicon carbide fiber includes exposing a silicon carbide fiber to a gaseous N precursor comprising nitrogen at an elevated temperature, thereby introducing nitrogen into a surface region of the silicon carbide fiber, and exposing the silicon carbide fiber to a gaseous B precursor comprising boron at an elevated temperature, thereby introducing boron into the surface region of the silicon carbide fiber. Silicon-doped boron nitride is formed at the surface region of the silicon carbide fiber without exposing the silicon carbide fiber to a gaseous Si precursor comprising Si. Thus, a moisture-tolerant coating comprising the silicon-doped boron nitride is grown in-situ on the silicon carbide fiber.

DETAILED DESCRIPTION

A new approach to forming a moisture-tolerant coating on a silicon carbide fiber is described herein. The new method, which may be referred to as a chemical vapor reaction or in-situ growth process, relies on chemical reactions occurring at the silicon carbide surface in the presence of selected gaseous precursors at high temperatures to form the moisture-tolerant coating.

Figure 1A:
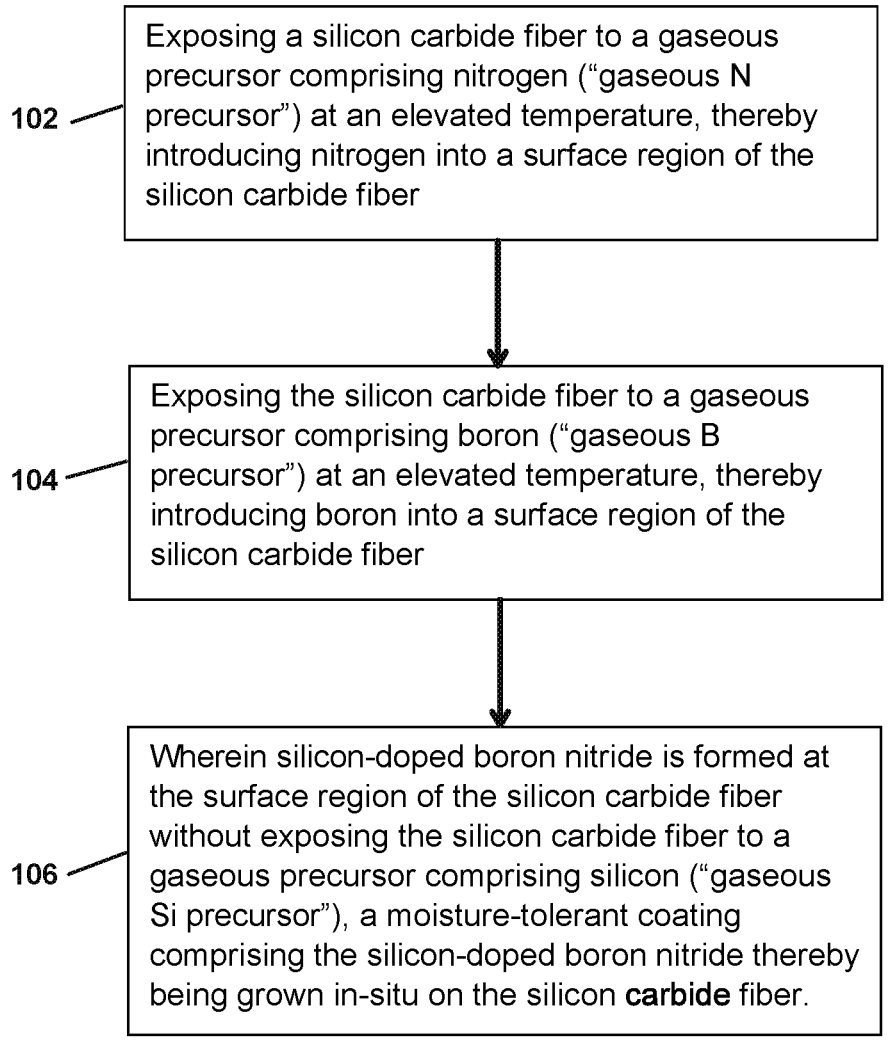
FIG. 1A shows a flow chart of the method according to a first embodiment.
Figure 1B:
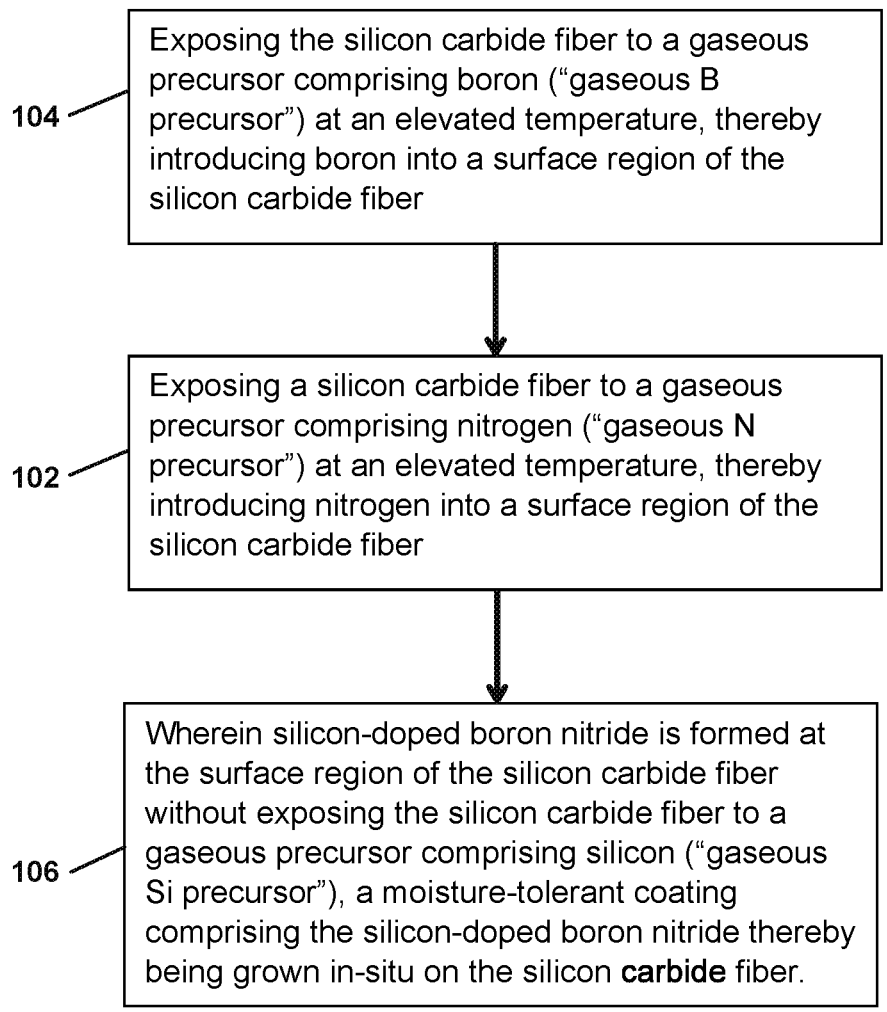
FIG. 1B shows a flow chart of the method according to a second embodiment.
Figure 1C:
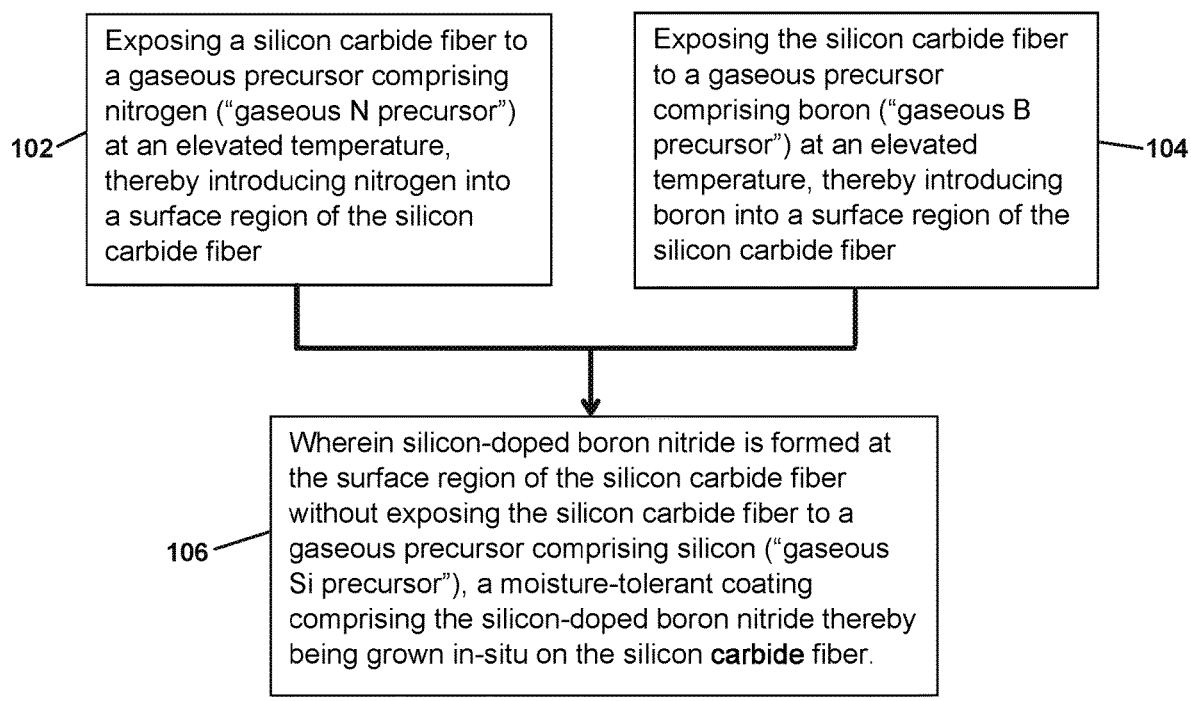
FIG. 1C shows a flow chart of the method according to a third embodiment.

Referring to FIGS. 1A-1C, the method entails exposing 102 a silicon carbide fiber to a gaseous precursor comprising nitrogen ("gaseous N precursor") at an elevated temperature, thereby introducing nitrogen into a surface region of the silicon carbide fiber, and exposing 104 the silicon carbide fiber to a gaseous precursor comprising boron ("gaseous B precursor") at an elevated temperature, thereby introducing boron into a surface region of the silicon carbide fiber. In contrast to prior investigations, silicon-doped boron nitride is formed 106 at the surface region of the silicon carbide fiber without exposing the silicon carbide fiber to a gaseous precursor comprising silicon ("gaseous Si precursor"). Thus, due to the elevated temperature exposure of the silicon carbide fiber to the gaseous N and B precursors, a moisture-tolerant coating comprising silicon-doped boron nitride is grown in-situ on the silicon carbide fiber. The silicon carbide fiber may be part of a fiber assembly arranged in the form of a tow, unidimensional tape, braid, and/or woven fabric (tooled and/or untooled), and the moisture-tolerant coating may be formed on each silicon carbide fiber in the fiber assembly.

As suggested in the flow chart of FIG. 1A, the exposure 102 of the silicon carbide fiber to the gaseous N precursor may occur prior to the exposure 104 of the silicon carbide fiber to the gaseous B precursor. Alternatively, the exposure 102 of the silicon carbide fiber to the gaseous N precursor may occur after the exposure 104 of the silicon carbide fiber to the gaseous B precursor, as shown in the flow chart of FIG. 1B. It is also contemplated that the exposure 102 of the silicon carbide fiber to the gaseous N precursor may occur simultaneously with the exposure 104 to the gaseous B precursor, as illustrated by the flow chart of FIG. 1C.

The gaseous N precursor may include one or more of ammonia, nitrogen gas ($N_2$), and hydrazine gas. Ammonia can dope the silicon carbide fiber with nitrogen while extracting carbon from the fiber via reaction of carbon with nascent hydrogen from the decomposition of ammonia. The gaseous B precursor, which may comprise a boron-containing hydride, halide, and/or oxide, provides boron at the surface region in exchange for silicon, resulting in the formation of silicon-doped boron nitride. The gaseous B precursor may include, for example, one or more of boron trichloride, boron trifluoride, and boric oxide gas.

The elevated temperature at which the exposure of the silicon carbide fiber to the gaseous N precursor occurs ("nitrogen exposure temperature") may be in a range from about 1200° C. to about 1800° C. The elevated temperature at which the exposure of the silicon carbide fiber to the gaseous B precursor occurs ("boron exposure temperature") may also be in the range from about 1200° C. to about 1800° C. The nitrogen and boron exposure temperatures may be the same temperature or may be different temperatures.

The method may be carried out in one or more chambers containing a suitable pressure of the gaseous N precursor and/or the gaseous B precursor. The method may be carried out under atmospheric or sub-atmospheric conditions. The method may be a batch process or a continuous process. In a batch process, the gaseous precursors may be introduced into the chamber for chemical reaction with the silicon carbide fiber(s) in separate steps, as described above in regard to FIGS. 1A and 1B, or simultaneously, as described with respect to FIG. 1C. In a continuous process, multiple chambers may be linked by transport chambers for continuous delivery of the silicon carbide fiber(s) therethrough. Each chamber may be backfilled with the respective gaseous N or B precursor at a suitable pressure, and valves or other sealing mechanisms may be employed to keep the chambers isolated from each other. The chamber(s) may be vacuum chamber(s) configured to maintain a controlled environment. The method may be carried out in a vacuum or an inert gas environment.

The method may further include, after the exposure of the silicon carbide fiber to the gaseous N and gaseous B precursors, heat treating the silicon carbide fiber in a controlled environment to promote diffusion and formation of the silicon-doped boron nitride at the surface region. The controlled environment may be a vacuum environment or an inert gas (e.g., argon or helium) environment at atmospheric or sub-atmospheric pressure, and the heat treatment may be carried out at a heat treatment temperature in a range from about 1200° C. to about 1800° C.

In some cases, the method may include exposing the silicon carbide fiber to a gaseous precursor comprising oxygen ("gaseous O precursor") at an elevated temperature, thereby introducing oxygen into the surface region of the silicon carbide fiber and inducing formation of silicon oxide from the silicon carbide. The optional exposure of the silicon carbide fiber to the gaseous O precursor may occur before the exposure of the silicon carbide fiber to the gaseous N precursor and/or before the exposure of the silicon carbide fiber to the gaseous B precursor. The elevated temperature at which the exposure of the silicon carbide fiber to the gaseous O precursor occurs may be in a range from about 1200° C. to about 1800° C., and may be the same as or different than the nitrogen and boron exposure temperatures.

The surface region of the silicon carbide fiber into which the boron and nitrogen are introduced during the chemical vapor reaction may have a depth in a range from about 0.01 micron to about –0.5 micron. Accordingly, the moisture-tolerant coating comprising silicon-doped boron nitride that is grown in-situ may have a thickness in the range from about 0.01 micron to about 0.5 micron. The thickness of the moisture-tolerant coating is preferably substantially uniform about the circumference of the silicon carbide fiber.

The silicon carbide fiber including the moisture-tolerant coating may undergo further processing to form a ceramic matrix composite. As indicated above, the silicon carbide fiber may be part of a fiber assembly (e.g., a tow, unidimensional tape, braid, and/or woven fabric) formed by lay-up of a plurality of ceramic fibers. After application of the moisture-resistant coating to the silicon carbide fiber (either individually or as part of the fiber assembly), the fiber assembly may be rigidized by applying a ceramic coating, such as a silicon carbide coating, thereto in order to form a porous fiber preform, as is known in the art. The method may further entail infiltrating the porous fiber preform with a slurry comprising ceramic particles (e.g., silicon carbide particles) dispersed in a liquid carrier (e.g., water), followed by drying to remove the liquid carrier. The ceramic particles remain in the porous fiber preform and form an impregnated fiber preform, which may be infiltrated with a melt comprising silicon for densification. The ceramic particles become part of the ceramic matrix after melt infiltration. Upon solidification of the melt, a ceramic matrix composite (CMC) including the silicon carbide fibers with the moisture-tolerant coating may be formed. The CMC, fabricated as described herein, may form part or all of a component for a gas turbine engine.

The ceramic fibers described above comprise silicon carbide, but it is also contemplated that the ceramic fibers may comprise another silicon-containing ceramic, such as silicon nitride, silicon oxycarbide, or silicon oxynitride. Similarly, the ceramic particles may comprise silicon carbide and/or another ceramic. In one embodiment, the ceramic matrix composite formed from the method is a silicon carbide fiber/silicon carbide matrix composite, or a SiC/SiC composite. As used herein, the term "silicon carbide" refers broadly to the compound SiC as well as to other silicon-containing carbides.

To clarify the use of and to hereby provide notice to the public, the phrases "at least one of <A>, <B>, ... and <N>" or "at least one of <A>, <B>, ... <N>, or combinations thereof" or "<A>, <B>, ... and/or <N>" are defined by the Applicant in the broadest sense, superseding any other implied definitions hereinbefore or hereinafter unless expressly asserted by the Applicant to the contrary, to mean one or more elements selected from the group comprising A, B, ... and N. In other words, the phrases mean any combination of one or more of the elements A, B, ... or N including any one element alone or the one element in combination with one or more of the other elements which may also include, in combination, additional elements not listed.

Although considerable detail with reference to certain embodiments has been described, other embodiments are possible. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages, and it is not necessarily expected that all of the described advantages will be achieved with every embodiment.

The invention claimed is:

1. A method of forming a moisture-tolerant coating on a silicon carbide fiber, the method comprising:

exposing a silicon carbide fiber to a gaseous N precursor comprising nitrogen at an elevated temperature, thereby introducing nitrogen into a surface region of the silicon carbide fiber; and exposing the silicon carbide fiber to a gaseous B precursor comprising boron at an elevated temperature, thereby introducing boron into the surface region of the silicon carbide fiber, wherein silicon-doped boron nitride is formed at the surface region of the silicon carbide fiber without exposing the silicon carbide fiber to a gaseous Si precursor comprising Si, a moisture-tolerant coating comprising the silicon-doped boron nitride thereby being grown in-situ on the silicon carbide fiber.

2. The method of claim 1, wherein the exposure of the silicon carbide fiber to the gaseous N precursor occurs prior to the exposure of the silicon carbide fiber to the gaseous B precursor.

3. The method of claim 1, wherein the exposure of the silicon carbide fiber to the gaseous B precursor occurs prior to the exposure of the silicon carbide fiber to the gaseous N precursor.

4. The method of claim 1, wherein the exposure of the silicon carbide fiber to the gaseous N precursor occurs simultaneously with the exposure of the silicon carbide fiber to the gaseous B precursor.

5. The method of claim 1, wherein the gaseous N precursor is selected from the group consisting of ammonia, nitrogen gas ($N_2$), and hydrazine gas.

6. The method of claim 1, wherein the gaseous B precursor comprises a boron-containing hydride, halide, or oxide.

7. The method of claim 6, wherein the boron-containing hydride, halide, or oxide is selected from the group consisting of boron trichloride, boron trifluoride, and boric oxide gas.

8. The method of claim 1, wherein the elevated temperature at which the exposure of the silicon carbide fiber to the gaseous N precursor occurs is in a range from about 1200° C. to about 1800° C., wherein the elevated temperature at which the exposure of the silicon carbide fiber to the gaseous B precursor occurs is in a range from about 1200° C. to about 1800° C.

9. The method of claim 1, further comprising exposing the silicon carbide fiber to a gaseous O precursor comprising oxygen at an elevated temperature.

10. The method of claim 9, wherein the exposure of the silicon carbide fiber to the gaseous O precursor occurs before the exposure of the silicon carbide fiber to the gaseous N precursor and/or before the exposure of the silicon carbide fiber to the gaseous B precursor.

11. The method of claim 9, wherein the elevated temperature at which the exposure of the silicon carbide fiber to the gaseous O precursor occurs is in a range from about 1200° C. to about 1800° C.

12. The method of claim 1, wherein the surface region has a depth in a range from about 0.01 micron to about 0.5 micron, the moisture-tolerant coating thereby having a thickness in the range from about 0.01 micron to about 0.5 micron.

13. The method of claim 1 being carried out in one or more chambers containing the gaseous N precursor and/or the gaseous B precursor at atmospheric or sub-atmospheric pressure.

14. The method of claim 13, wherein the chamber comprises an inert gas or a vacuum environment.

15. The method of claim 1, further comprising, after the exposure of the silicon carbide fiber to the gaseous N and gaseous B precursors, heat treating the silicon carbide fiber in a controlled environment to promote diffusion and formation of the silicon-doped boron nitride at the surface region.

16. The method of claim 15, wherein the controlled environment comprises a vacuum environment or an inert gas environment at atmospheric or sub-atmospheric pressure.

17. The method of claim 1 being a continuous process.

18. The method of claim 1 being a batch process.

19. The method of claim 1, wherein the silicon carbide fiber is part of a fiber assembly arranged in the form of a tow, unidimensional tape, braid, and/or woven fabric, and wherein the moisture-tolerant coating is formed on each of the silicon carbide fibers in the fiber assembly.

20. The method of claim 19, further comprising:

rigidizing the tow, unidimensional tape, braid, and/or woven fabric by applying a ceramic coating thereto, thereby forming a porous fiber preform;

infiltrating the porous fiber preform with a slurry comprising ceramic particles dispersed in a liquid carrier and drying the slurry to remove the liquid carrier, the ceramic particles remaining in the porous fiber preform, thereby forming an impregnated fiber preform; and infiltrating the impregnated fiber preform with a melt comprising silicon, thereby forming, upon solidification of the melt, a ceramic matrix composite including the silicon carbide fibers comprising the moisture-tolerant coating.

* * * * *